US007443252B2

(12) United States Patent
Tu et al.

(10) Patent No.: US 7,443,252 B2
(45) Date of Patent: Oct. 28, 2008

(54) CALIBRATION CIRCUIT AND OPERATION METHOD FOR VOLTAGE-CONTROLLED OSCILLATOR

(75) Inventors: Yih-Min Tu, Hsinchu County (TW); Yuan-Tung Peng, Hsinchu (TW); Ping-Hsun Hsieh, Taoyuan County (TW); Min-Chieh Hsu, Taipei County (TW)

(73) Assignee: Novatek Microelectronics Corp., Hsinchu (TW)

( * ) Notice: Subject to any disclaimer, the term of this patent is extended or adjusted under 35 U.S.C. 154(b) by 65 days.

(21) Appl. No.: 11/309,129

(22) Filed: Jun. 26, 2006

(65) Prior Publication Data

US 2007/0080751 A1 Apr. 12, 2007

(30) Foreign Application Priority Data

Oct. 6, 2005 (TW) .............................. 94134932 A

(51) Int. Cl.
*G01R 23/00* (2006.01)
*H03L 7/08* (2006.01)

(52) U.S. Cl. ........................... 331/44; 331/16; 331/179; 327/157

(58) Field of Classification Search ................... 331/10, 331/14, 16, 17, 18, 25, 36 C, 1 A, 177 R, 331/179, 177 V; 327/156, 157; 375/373, 375/374, 376

See application file for complete search history.

(56) References Cited

U.S. PATENT DOCUMENTS

| | | | | |
|---|---|---|---|---|
| 4,546,330 | A * | 10/1985 | Okada | 331/17 |
| 5,382,922 | A * | 1/1995 | Gersbach et al. | 331/1 A |
| 6,114,920 | A * | 9/2000 | Moon et al. | 331/179 |
| 6,744,324 | B1 | 6/2004 | Adams et al. | 331/17 |
| 2005/0057289 | A1 * | 3/2005 | Pham | 327/156 |
| 2005/0062551 | A1 * | 3/2005 | Coppola et al. | 331/36 C |
| 2005/0258906 | A1 * | 11/2005 | Su et al. | 331/10 |

* cited by examiner

*Primary Examiner*—Robert J. Pascal
*Assistant Examiner*—Ryan J. Johnson
(74) *Attorney, Agent, or Firm*—Jianq Chyun IP Office

(57) ABSTRACT

A calibration circuit for voltage-controlled oscillator (VCO) includes a calibration bias generator, a VCO, a detection unit, a micro control unit, an adjuster unit, a phase-locked loop (PLL) unit, a control voltage detection unit, and a control switch set. The calibration bias generator outputs a first control voltage. The VCO outputs an oscillation frequency according to the first control voltage. The detection unit detects the oscillation frequency and outputs the detection result signal to the micro control unit. The micro control unit outputs an adjust signal according to the detection result signal. The adjuster unit receives the adjust signal voltage and adjusts the oscillation frequency output from the VCO according to the adjust signal voltage. The PLL unit outputs a second control voltage to the VCO. The control voltage detection unit outputs voltage-detection signal to the micro control unit, which outputs the adjust signal according to the voltage-detection signal.

15 Claims, 4 Drawing Sheets

CALIBRATION CIRCUIT AND OPERATION METHOD FOR VOLTAGE-CONTROLLED OSCILLATOR

CROSS-REFERENCE TO RELATED APPLICATION

This application claims the priority benefit of Taiwan application serial no. 94134932, filed on Oct. 6, 2005. All disclosure of the Taiwan application is incorporated herein by reference.

BACKGROUND OF THE INVENTION

1. Field of Invention

The present invention relates to a voltage-controlled oscillator (VCO) and more particularly to a calibration circuit for the VCO, suitable for calibrating the oscillation frequency of the VCO.

2. Description of Related Art

Referring to FIG. 1, it depicts a conventional frequency synthesizer for the voltage-controlled oscillator (VCO), having the adjustment function. As shown in the drawing, the frequency synthesizer comprises a VCO 101, a programmable control frequency divider 103, a phase detector 105, a charge pump 109 and a loop filter 111. The phase detector 105 simultaneously receives a reference frequency 107 and an output signal from the programmable control frequency divider 103, computes the reference frequency 107 and the output signal for obtaining a result, and transfers the result to the loop filter 111. The loop filter 111 transfers the result to the VCO 101.

Moreover, the frequency synthesizer further comprises a compensation unit 113 having a local oscillator 115, a combiner 117, and a low-pass filter 119. The compensation unit 113 receives the oscillation frequency output from the VCO 101 and outputs the signal to the programmable control frequency divider 103.

In the conventional art, the frequency synthesizer further comprises a replica charge pump 121 used for providing a test signal required in the calibration of the oscillation frequency. The replica charge pump 121 is under the control of a micro control unit 123. The micro control unit 123 contains the calibration action and data required in the calibration of the frequency. Furthermore, a frequency measurement unit 137 in the frequency synthesizer receives the reference frequency 107 and the signal output from the programmable control frequency divider 103 to provide the frequency indication signal to the micro control unit 123 for frequency calibration.

Additionally, the frequency synthesizer further has an adjuster unit 125 for the VCO inside. The adjuster unit 125 for the VCO comprises a sense amplifier 127, an analog-to-digital converter 129, a temperature sensor 133, a selector 131, and a capacitance storage unit 135. The analog-to-digital converter 129 is used to provide a digital signal to the micro control unit 123 to adjust the range of the oscillation frequency and to set the output signal of the programmable control frequency divider 103 close to the predetermined oscillation frequency as much as possible.

In the conventional technology described above, the frequency synthesizer has the function of auto-adjusting the oscillation frequency, but the design of the circuit is rather complex and each of the control units further comprises a plurality of control devices, which causes an increase of the manufacturing cost of the circuit and the difficulty in the design of the circuit.

SUMMARY OF THE INVENTION

It is an object of the present invention to provide a calibration circuit for VCO, suitable for adjusting the oscillation frequency output from the VCO in open loop so as to enable the oscillation frequency to operate within the predetermined frequency range.

Another object of the present invention is to provide an operation method of the calibration circuit for the VCO. In the operation method, the operating voltage range can be adjusted according to the control voltage output from the loop filter in closed loop to enable the oscillation frequency and the control voltage output from the loop filter to operate within the predetermined range.

The present invention provides a calibration circuit for the VCO, which comprises a calibration bias generator, a voltage-controlled oscillator (VCO), a detection unit, a micro control unit, an adjuster unit, a phase-locked loop (PLL) unit, a control voltage detection unit and a control switch set. An output terminal of the calibration bias generator described above outputs a first control voltage. A first input terminal of the VCO described above receives the first control voltage, and the output terminal of the VCO outputs an oscillation frequency according to the first control voltage. The detection unit described above is used to detect the above oscillation frequency and outputs a detection result signal.

The micro control unit described above receives the detection result signal and outputs an adjust signal according to the detection result signal. The adjuster unit described above receives the adjust signal and outputs a voltage-adjusting signal to a second input terminal of the VCO according to the adjust signal in order to adjust the oscillation frequency output from the VCO. An input terminal of the phase-locked loop (PLL) unit described above receives the oscillation frequency and outputs a second control voltage to the first input terminal of the VCO according to the oscillation frequency.

The input terminal of the control voltage detection unit described above receives the second control voltage and outputs a voltage-detection signal to the micro control unit according to the second control voltage, and the micro control unit outputs the adjust signal according to the voltage-detection signal. The control switch set described above is coupled to the output terminal of the PLL unit, the input terminal of the control voltage detection unit, the output terminal of the calibration bias generator, and the first input terminal of the VCO, so as to control the couple between each of the units.

According to the preferred embodiment of the present invention, the adjuster unit is a switch adjusting capacitor. The detection unit is a counter.

According to the preferred embodiment of the present invention, the PLL unit described above comprises a frequency divider, a loop filter, a charge pump and a phase detector. The input terminal of the frequency divider described above receives the oscillation frequency. The first input terminal of the phase detector receives a reference voltage. The second input terminal of the phase detector is coupled to the output terminal of the frequency divider. The input terminal of the charge pump is coupled to the output terminal of the phase detector. The input terminal of the loop filter is coupled to the output terminal of the charge pump. The output terminal of the loop filter outputs the second control voltage.

According to the preferred embodiment of the present invention, the first control voltage described above is used to adjust the oscillation frequency to operate within the predetermined operating frequency range. The micro control unit records the present state of the adjuster unit, when the oscillation frequency operates within the predetermined operating frequency range.

According to the preferred embodiment of the present invention, the second control voltage described above is used to adjust the oscillation frequency to operate at a predetermined operating frequency point. The micro control unit records the state of the adjuster unit, when the oscillation frequency operates at the predetermined operating frequency point.

According to the preferred embodiment of the present invention, the control switch set described above comprises a first switch, a second switch and a third switch. The first end of the first switch described above is coupled to the output terminal of the calibration bias generator, and the second end is coupled to the first input terminal of the VCO. The first end of the second switch is coupled to the input terminal of the voltage detection unit, and the second end of the second switch is coupled to the first input terminal of the VCO. The first end of the third switch described above is coupled to the output terminal of the PLL unit, and the second end is coupled to the first input terminal of the VCO.

According to the preferred embodiment of the present invention, while the first switch described above is ON, the second switch and the third switch are OFF in the open loop; and while the first switch is OFF, the second switch and the third switch are ON in the close loop.

According to the preferred embodiment of the present invention, the voltage detection unit described above comprises a first comparator and a second comparator. The first input terminal of the first comparator described above receives the first predetermined voltage, and the second input terminal receives the second control voltage. The output terminal of the first comparator outputs a first comparison signal according to the result of comparing the first and second input terminals of the first comparator. The first input terminal of the second comparator described above receives the second predetermined voltage, and the second input terminal receives the second control voltage. The output terminal of the second comparator outputs a second comparison signal according to the result of comparing the first and second input terminals of the second comparator. The micro control unit receives the first and second comparison signals, and then outputs an adjust signal according to the first and second comparison signals.

According to the preferred embodiment of the present invention, the first comparator and the second comparator described above are operational amplifiers, wherein the first input terminals thereof are negative input terminals, and the second input terminals are positive input terminals.

The present invention further provides a method of operating the calibration circuit for the VCO. The method can be used to adjust the oscillation frequency output from the VCO. The method of operating the calibration circuit for VCO comprises firstly receiving the first control voltage and outputting the oscillation frequency according to the first control voltage by the VCO; then detecting the operating frequency of the oscillation frequency, and adjusting the oscillation frequency to operate within the predetermined operating frequency range according to the detection result; and then detecting the operating frequency point of the oscillation frequency and adjusting the oscillation frequency to operate at the predetermined operating frequency point according to the detection result.

Therefore, the present invention employs a two-stage adjustment including firstly adjusting the oscillation frequency to operate within the predetermined frequency range; and then adjusting the control voltage in closed loop to fall in the correct operating voltage range. The control voltage is adjusted through the comparison of the voltages, thus the complexity of the circuit can be simplified while the original function of adjusting the oscillation frequency is maintained.

In order to the make the aforementioned and other objects, features and advantages of the present invention more comprehensible, preferred embodiments accompanied with appended drawings are described in detail below.

DESCRIPTION OF EMBODIMENTS

The calibration circuit for the voltage-controlled oscillator (VCO) of the present invention is characterized by the two-staged adjustment including firstly adjusting the oscillation frequency to operate within the predetermined frequency range; then adjusting the control voltage 205*a* (FIG. 2) in closed loop to fall in the correct operating voltage range. Moreover, the control voltage is adjusted through the comparison of the voltages by the calibration circuit for the VCO. Therefore, the complexity of the circuit can be decreased effectively.

Figure 1:
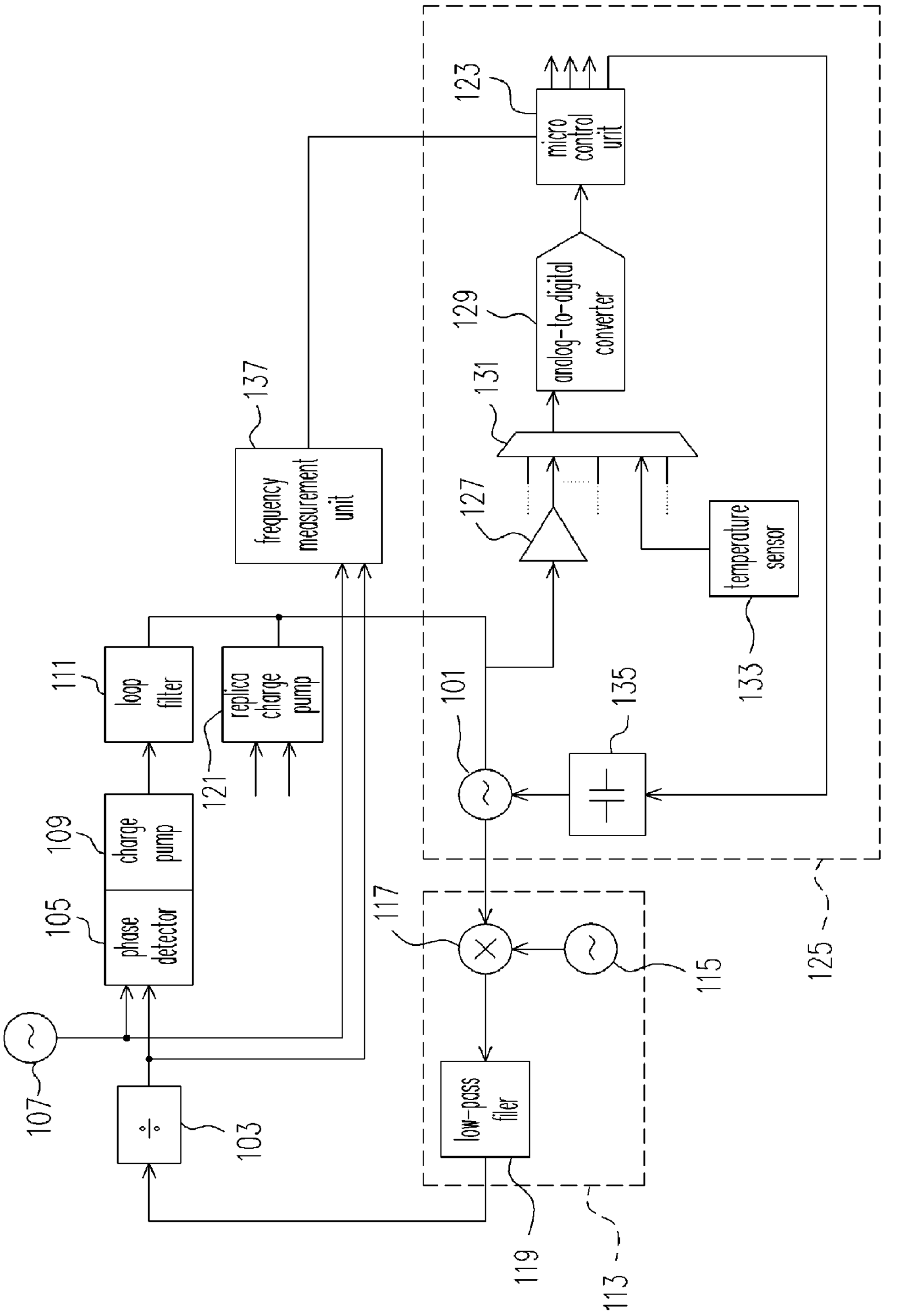
FIG. 1 is a conventional frequency synthesizer of the VCO, having the adjustment function.
Figure 2:
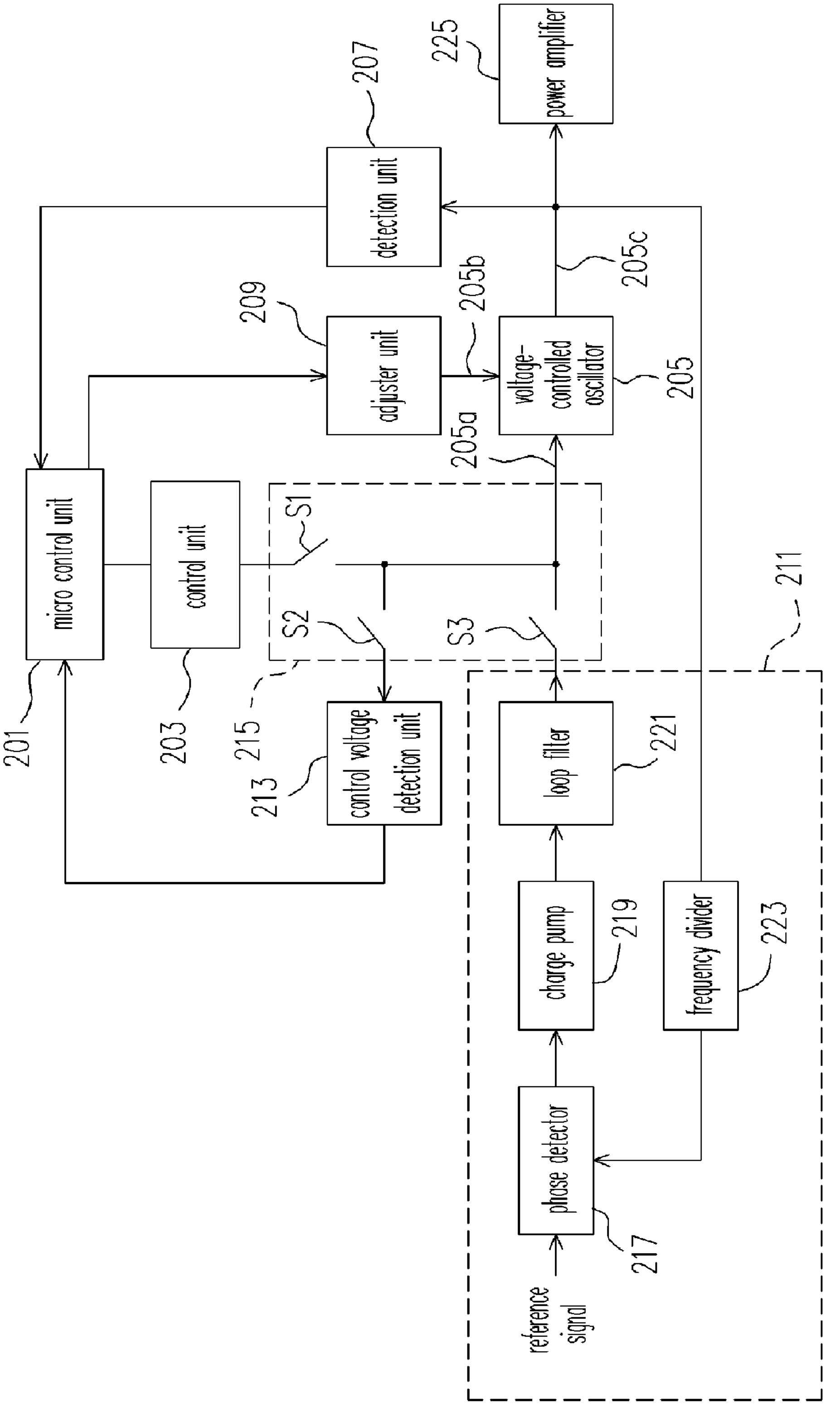
FIG. 2 is a block view of the calibration circuit for the VCO of the present invention.

Referring to FIG. 2, it is a block view of the calibration circuit for the VCO of the present invention. The main function of the calibration circuit for the VCO is to adjust whether the oscillation frequency output from the output terminal 205*c* of the VCO 205 operates at the predetermined frequency point. When the oscillation frequency output from the VCO 205 offset, the calibration circuit for the VCO will adjust automatically to enable the VCO 205 to keep up outputting stable oscillation frequency.

As shown in the drawings, for the calibration circuit for the VCO, the calibration bias generator 203 outputs a first control voltage firstly, then the VCO 205 receives the first control voltage output by the calibration bias generator 203 from the first input terminal 205*a*, and outputs the oscillation frequency from the output terminal 205*c* of the control oscillator 205 according to the first control voltage.

Additionally, as shown in the drawing, the input terminal of the detection unit 207 receives and detects the oscillation frequency output by the output terminal 205*c* of the VCO 205, and the output terminal outputs the detection result as a detection result signal to the micro control unit 201. In the embodiment, the detection unit 207 described above can include a counter.

For the calibration circuit for the VCO, the micro control unit 201 is used to determine whether the oscillation frequency output from the VCO 205 is within the predetermined frequency range. Sequentially, when the micro control unit 201 receives the detection result signal output by the detection unit 207, it will determine according to the detection result signal. And when it is determined by the micro control unit that the oscillation frequency output from the VCO 205 offset, the micro control unit will output an adjust signal to the adjuster unit 209.

The adjuster unit 209 described above outputs a corresponding voltage-adjusting signal according to the adjust signal. The VCO receives the voltage-adjusting signal through the second input terminal 205*b*, and changes the oscillation frequency output from itself according to the voltage-adjusting signal. The calibration circuit for the VCO repeats the adjustment described above continuously until the oscillation frequency output from the VCO 205 has been adjusted to fall in the predetermined frequency range.

The calibration circuit for the VCO proceeds to adjust the operating frequency point of the oscillation frequency when it has adjusted the oscillation frequency to fall in the predetermined frequency range. Firstly, the PLL unit 211 is coupled to the output terminal 205*c* of the VCO 205 to receive the oscillation frequency output from the output terminal. And the PLL unit 211 outputs a corresponding second control voltage to the first input terminal 205*a* of the VCO 205 according to the received oscillation frequency.

At this time, the control voltage detection unit 213 receives the voltage value of the second control voltage, and transfers the detection result to the micro control unit 201. The micro control unit 201 outputs the adjust signal to the adjuster unit 209 through the output terminal according to the detection result of the control voltage detection unit 213, and resets the inner circuit of the adjuster unit to finely adjust the oscillation frequency again. The calibration circuit for VCO repeats the adjustment described above until the oscillation frequency output from the VCO 205 has been adjusted to the predetermined operating frequency point.

The PLL unit 211 consists of a frequency divider 223, a phase detector 217, a charge pump 219 and a loop filter 221. The PLL unit 211 receives the oscillation frequency output from the VCO 205 through the frequency divider 223 that divides the frequency simultaneously. Then, the oscillation frequency after being divided is transferred to phase detector 217 to be compared with the reference signal received by another input terminal of the phase detector 217. And then, the result is transferred to the charge pump 219 to carry out current excitation. Finally, the above second control signal is output by the loop filter 221.

In the embodiment, since the PLL unit 211 described above is used to output a corresponding voltage value according to the received oscillation frequency, any PLL circuits capable of achieving this function can be used in the embodiment of the present invention.

The control switch set 215 illustrated above consists of a first switch S1, a second switch S2 and a third switch S3. The first end of the first switch S1 is coupled to the output terminal of the calibration bias generator 203, and the second end is coupled to the first input terminal 205*a* of the VCO 205. The first end of the second switch S2 is coupled to the input terminal of the voltage detection unit 213, and the second end is coupled to the first input terminal 205*a* of the VCO 205. The first end of the third switch S3 is coupled to the output terminal of the PLL unit 211, and the second end is coupled to the first input terminal 205*a* of the VCO 205.

In this embodiment, it is set to adjust the operating frequency range of the oscillation frequency firstly, and then adjust the operating frequency point of the oscillation frequency. In order to achieve this purpose, the calibration circuit for VCO controls the couple between each of the units by using the switches within the control switch set 215 so as to determine the adjustment of the operating frequency range or the operating frequency point.

When the calibration circuit for VCO is intended to adjust the operating frequency range of the oscillation frequency firstly, the first switch S1 is set be to ON, and the second switch S2 and the third switch S3 are set to OFF in open loop. Therefore, the loop from the first calibration bias generator 203 to the VCO 205 is ON. According to the detection result of the detection unit 207, the micro control unit 201 can adjust the output oscillation frequency of the VCO 205 through the adjuster unit 209. At this time, since the loop of the PLL unit 211 and control voltage detection unit 213 and the micro control unit 201 and the voltage-controlled unit 205 is not formed, it is impossible for the micro control unit to adjust the operating frequency point of the oscillation frequency output by VCO 205.

After the calibration circuit for VCO has completed the adjustment of the oscillation frequency range, the state of the switches within the control switch set 215 is changed. The first switch S1 is changed to OFF, while the second switch and the third switch are changed to ON in the close loop. At this time, the loop from the first calibration bias generator 203 to the VCO 205 has been cancelled, and the loop among the micro control unit 201, the PLL unit 211, and the control voltage detection unit 213 has formed, therefore the micro control unit 201 can adjust the oscillation frequency point of the output oscillation frequency of the VCO 205 by using the adjuster unit 209 according to the detection result of the control voltage detection unit 213, until the oscillation frequency output by the VCO 205 has been at the predetermined frequency point.

Figure 3:
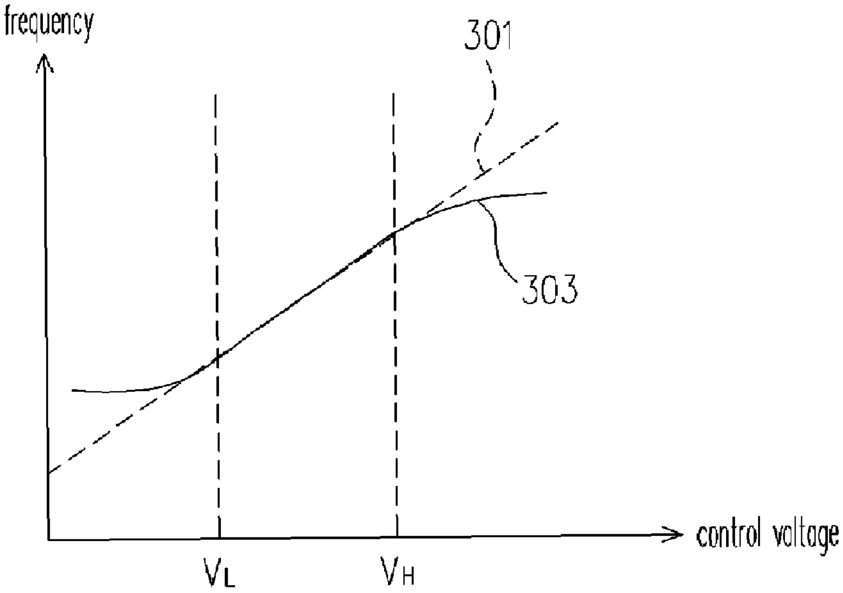
FIG. 3 is a comparison diagram of the oscillation frequency versus the control voltage of a common VCO.

Referring to FIG. 3, a comparison diagram of the oscillation frequency versus the control voltage of a common VCO. There are two curves in the diagram. The curve 301 is a comparison curve of the ideal oscillation frequency versus the ideal control voltage, and the curve 303 is a curve of the actual oscillation frequency versus the actual control voltage. The curve 301 is a linearly changing curve, and the curve 303 only presents linear change at the portion adjacent to the middle positions. In general, it is intended to control the oscillation frequency output by the VCO at the linear change position of the curve when designing the circuit. As shown in this figure, the linear change positions of the curve 303 refer to the positions between $V_L$ and $V_H$.

It is disclosed in the aforementioned embodiments that the calibration circuit for VCO firstly adjusts the operating frequency range of the oscillation frequency output by VCO 205, which means the oscillation frequency is firstly adjusted between the linear positions $V_L$ and $V_H$ of the curve 303. When the adjustment of the oscillation frequency range is completed, the oscillation frequency can be finely adjusted to operate at the best operating frequency point. The best operating frequency point is the middle portion between $V_L$ and $V_H$ according to the curves in FIG. 3.

Figure 4:
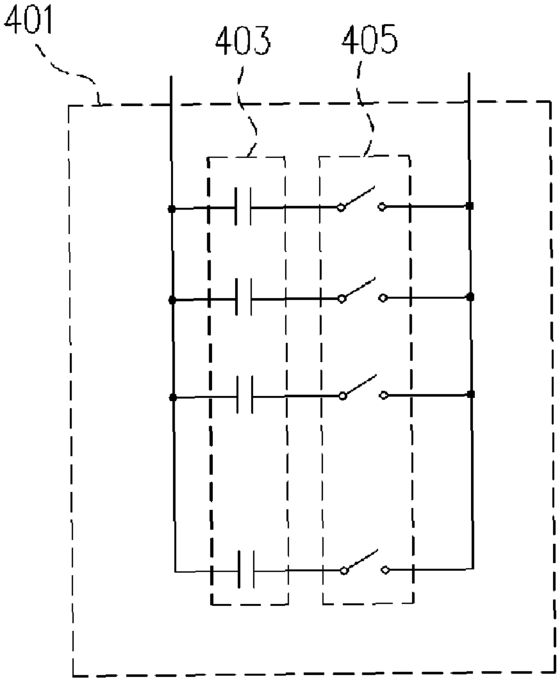
FIG. 4 is an inner circuit diagram of the adjuster unit in the calibration circuit for the VCO of the present invention.

Referring to FIG. 4, which is an inner circuit diagram of the adjuster unit in the calibration circuit for the VCO of the present invention. While only one set of switch adjusting capacitor 403 and a corresponding one set of switch 405 is shown in the drawing, the adjuster unit 401 may comprises a plurality sets of switch adjusting capacitors 403 and a plurality sets of switches 405, and each set of the switch adjusting capacitor is coupled to a corresponding set of switch dependently. The adjuster unit 401 changes the value of the voltage-adjusting signal output by the adjuster unit 401 according to the ON/OFF of the switch.

In the embodiment, the adjuster unit 209 changes the ON/OFF state of the inner switch adjusting capacitor according to the adjust signal output by the micro control unit 201, thus achieving the object of adjusting the oscillation frequency output by VCO 205. Additionally, when the VCO 205 has finished the adjustment of the operating frequency point and the operating frequency range, the micro control unit 201 records the present state of the switch adjusting capacitor within the adjuster unit 209.

Figure 5:
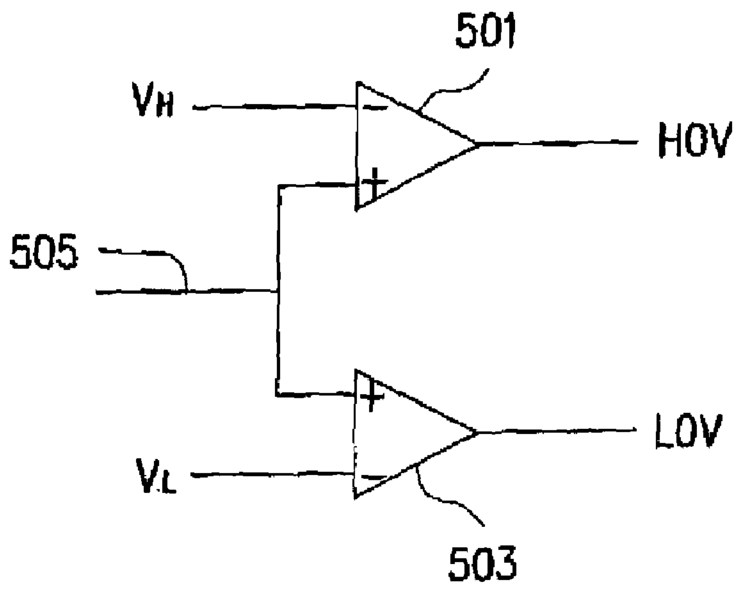
FIG. 5 is an inner circuit diagram of the control voltage detection unit in the calibration circuit for the VCO of the present invention.

Referring to FIG. 5, an inner circuit diagram of the control voltage detection unit in the calibration circuit for the VCO of the present invention. As shown in the drawings, the control voltage detection unit 213 consists of a first comparator 501 and a second comparator 503. In the embodiment, the first comparator 501 and the second comparator 503 are composed of operational amplifiers.

The negative input terminal of the first comparator 501 receives the first predetermined voltage $V_H$. The first predetermined voltage $V_H$ is the highest voltage value in the linear change range of the curve 303 shown in FIG. 3. The positive input terminal of the first comparator 501 receives the second control voltage output by the PLL unit 211.

Additionally, the negative input terminal of the second comparator 503 receives the second predetermined voltage $V_L$. Similarly to the first predetermined voltage $V_H$ described above, the second predetermined voltage $V_L$ is the lowest voltage value in the linear change range of the curve 303 shown in FIG. 3. The positive input terminal of the second comparator 503 receives the second control voltage output by the PLL unit 211.

When the calibration circuit for VCO starts to adjust the operating frequency point of the oscillation frequency output by the VCO 205, the PLL unit 211 will output the second control voltage through the output terminal according to the oscillation frequency received by the input terminal. At this time, after the control voltage detection unit 213 has received the second control voltage through the input terminal 503, the first comparator 501 and the second comparator 503 will start to compare and transfer the result to the micro control unit 201.

When the operating frequency point of the oscillation frequency is within the linear change range of the curve 303, the output terminal HOV of the first comparator 501 is at a low voltage level “0”, and the output terminal LOV of the second comparator 503 is at a high voltage level “1”. When the signal of the output terminal HOV received by the micro control unit 201 is “0” and the signal of the output terminal LOV is “1”, which means the oscillation frequency has been adjusted to the predetermined operating frequency point, the micro control unit 201 then stops the adjustment and records the present state of the adjuster unit.

Definitely, provided that the output signals of the output terminals HOV and LOV are not in the above mentioned state, it means that the operating frequency point of the oscillation frequency is not at the predetermined oscillation frequency point, therefore the micro control unit 201 will keep up changing the state of the adjuster unit 209 until the operating frequency point of the oscillation frequency is adjusted to fall in the predetermined range.

For the calibration circuit for VCO according to the present invention, the output terminal of the inner VCO 205 can output an oscillation frequency stably, so as to enable the next level circuit being coupled to the calibration circuit for VCO to maintain the normal operation. As shown in FIG. 2, the output terminal of the calibration circuit for VCO can be coupled to a power amplifier 225 and the action thereof is controlled by the oscillation frequency output by VCO 205.

Figure 6:
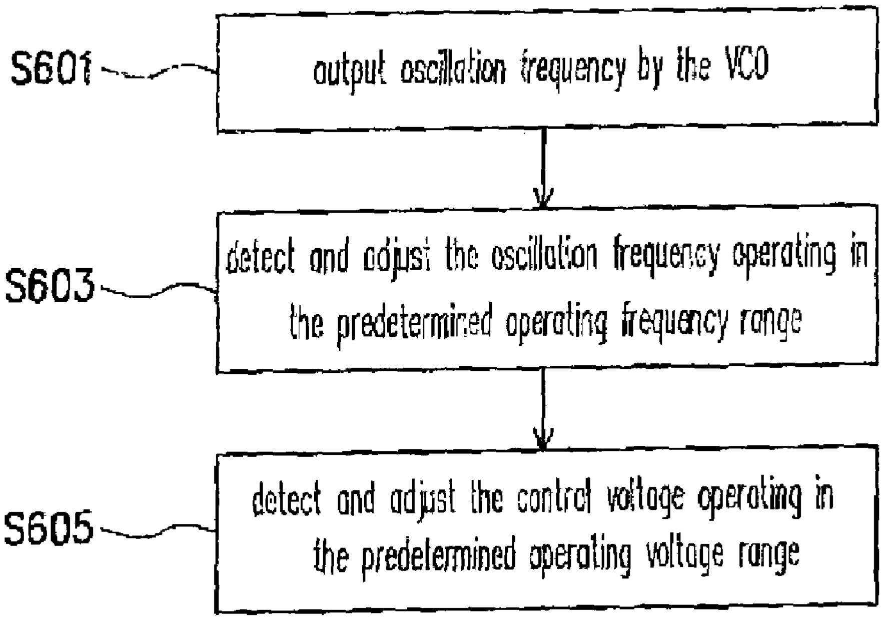
FIG. 6 is a flow chart of the method of operating the calibration circuit for the VCO.

Referring to FIG. 6, it is a flow chart of the method of operating the calibration circuit for the VCO, which is illustrated by the embodiment in FIG. 2. Firstly, in step S601, an oscillation frequency is produced by the VCO. Then, in step S603, the oscillation frequency described above is detected in order to determine whether the oscillation frequency operates within the predetermined operating frequency range, if the oscillation frequency is not within the predetermined frequency range, the adjustment will be carried out.

The actions in this step are equal to the actions in the embodiment of FIG. 2. The detection unit 207 is used to carry out the detection action. Then the determination is made by the micro control unit 201. And then, the object of adjusting the operating frequency range of the oscillation frequency is achieved by the control adjuster unit 209. When the adjustment of the operating frequency range is finished, the micro control unit 201 records the state of the adjuster unit 209 and proceeds to the next step.

In step S605, the oscillation frequency has been operating within the predetermined frequency range, and at this time, the control voltage 205*a* is under the detection to determine whether the control voltage 205*a* in closed loop operates within the predetermined operating voltage range. Similarly, if the control voltage is not within the predetermined operating voltage range, the adjustment is carried out, so as to enable the control voltage to operate within the predetermined operating voltage range.

The action in step S605 is equal to that in the embodiment of FIG. 2. The control voltage detection unit 213 is used to detect the control voltage. Then, the detection result is transferred to the micro control unit 201 to be determined. Finally, the control voltage can operate within the predetermined operating voltage range by changing the inner circuit of the adjuster unit 209. Therefore, it is possible to output the stable oscillation frequency and the constant VCO gain (the slope of the curves in FIG. 3) so as to drive the normal action of the next-level circuit.

In view of the above, the calibration circuit for VCO according to the present invention employs a two-stage adjustment including firstly adjusting the oscillation frequency to operate within the predetermined frequency range; then adjusting the control voltage to fall in the correct operating voltage range. Moreover, the calibration circuit for VCO according to the present invention is used to adjust the control voltage based on the comparison of the voltages. Therefore, the complexity of the circuit can be effectively decreased, and the original function of adjusting the oscillation frequency is also maintained.

Although the present invention is disclosed as above by preferred embodiments, they are not intended to limit the present invention. Various variations and modifications can be made by those skilled in the art without departing from the spirit and scope of the present invention, and the scope of the present invention shall be defined by the appended claims.

What is claimed is:

1. A calibration circuit for voltage-controlled oscillator (VCO), comprising:

a control unit, with an output terminal outputting a first control voltage;

a voltage-controlled oscillator, with a first input terminal receiving the first control voltage and outputting an oscillation frequency from its output terminal according to the first control voltage;

a detection unit for detecting the oscillation frequency and outputting a detection result signal;

a micro control unit, receiving the detection result signal and outputting an adjust signal according to the detection result signal;

an adjuster unit for receiving the adjust signal and outputting a voltage-adjusting signal to a second input terminal of the VCO according to the adjust signal so as to adjust the oscillation frequency output from the VCO;

a phase-locked loop (PLL) unit, with an input terminal receiving the oscillation frequency and outputting a second control voltage to the first input terminal of the VCO according to the oscillation frequency;

a control voltage, detection unit, with an input terminal receiving the second control voltage and outputting a voltage-detection signal to the micro control unit according to the second control voltage, wherein the micro control unit outputs the adjust signal according to the voltage-detection signal; and a control switch set coupled to the output terminal of the PLL unit, the input terminal of the control voltage detection unit, the output terminal of the control unit, and the first input terminal of the VCO to control the connection between each of the units.

2. The calibration circuit for voltage-controlled oscillator as claimed in claim 1, wherein the control unit is a calibration bias generator.

3. The calibration circuit for voltage-controlled oscillator as claimed in claim 1, wherein the adjuster unit is a switch adjusting capacitor.

4. The calibration circuit for voltage-controlled oscillator as claimed in claim 1, wherein the detection unit is a counter.

5. The calibration circuit for voltage-controlled oscillator as claimed in claim 1, wherein the PLL unit comprises:

a frequency divider, with an input terminal receiving the oscillation frequency;

a phase detector, with a first input terminal receiving a reference voltage, and a second input terminal coupled to the output terminal of the frequency divider;

a charge pump, with an input terminal coupled to the output terminal of the phase detector; and a loop filter, with an input terminal coupled to the output terminal of the charge pump, and an output terminal outputting the second control voltage.

6. The calibration circuit for voltage-controlled oscillator as claimed in claim 1, wherein the first control voltage is used for adjusting the oscillation frequency to operate within a predetermined operating frequency range.

7. The calibration circuit for voltage-controlled oscillator as claimed in claim 6, wherein the micro control unit records a state of the adjuster unit when the oscillation frequency operates within the predetermined operating frequency range.

8. The calibration circuit for voltage-controlled oscillator as claimed in claim 1, wherein the second control voltage is used for adjusting the oscillation frequency to operate at a predetermined operating frequency point.

9. The calibration circuit for voltage-controlled oscillator as claimed in claim 8, wherein the micro control unit records a state of the adjuster unit when the oscillation frequency operates at the predetermined operating frequency point.

10. The calibration circuit for voltage-controlled oscillator as claimed in claim 1, wherein the control switch set comprises:

a first switch, with a first end coupled to the output terminal of the control unit, and a second end coupled to the first input terminal of the VCO;

a second switch, with a first end coupled to the input terminal of the voltage detection unit, and a second end coupled to the first input terminal of the VCO; and a third switch, with a first end coupled to the output terminal of the PLL unit, and a second end coupled to the first input terminal of the VCO.

11. The calibration circuit for voltage-controlled oscillator as claimed in claim 10, wherein the second switch and the third switch are OFF when the first switch is ON.

12. The calibration circuit for voltage-controlled oscillator as claimed in claim 10, wherein the second switch and the third switch are ON when the first switch is OFF.

13. The calibration circuit for voltage-controlled oscillator as claimed in claim 1, wherein the voltage detection unit comprises:

a first comparator, with a first input terminal receiving a first predetermined voltage, a second input terminal receiving the second control voltage, and an output terminal outputting a first comparison signal according to the result of comparing its first input terminal and second input terminal;

a second comparator, with a first input terminal receiving a second predetermined voltage, a second input terminal receiving the second control voltage, and an output terminal outputting a second comparison signal according to the result of comparing the first input terminal and second input terminal;

wherein, the micro control unit receives the first and second comparison signals and outputs the adjust signal according to the first and second comparison signals.

14. The calibration circuit for voltage-controlled oscillator as claimed in claim 13, wherein the first and second comparators are an operational amplifier.

15. The calibration circuit for voltage-controlled oscillator as claimed in claim 14, wherein the first input terminal of the operational amplifier is a negative input terminal, and the second input terminal of the operational amplifier is a positive input terminal.

* * * * *